United States Patent [19]

Kamakura et al.

[11] Patent Number: 5,389,551
[45] Date of Patent: Feb. 14, 1995

[54] METHOD OF MANUFACTURING A SEMICONDUCTOR SUBSTRATE

[75] Inventors: Takanobu Kamakura, Yokosuka; Youji Yamashita, Yokohama, both of Japan

[73] Assignee: Kabushiki Kaisha Toshiba, Kawasaki, Japan

[21] Appl. No.: 24,839

[22] Filed: Mar. 1, 1993

Related U.S. Application Data

[62] Division of Ser. No. 838,691, Feb. 21, 1992, abandoned.

[30] Foreign Application Priority Data

Feb. 21, 1991 [JP] Japan ................................. 027551

[51] Int. Cl.$^6$ ..................................... H01L 21/306
[52] U.S. Cl. ................................. 437/10; 437/12; 437/11; 437/939; 437/946; 437/105; 148/DIG. 60
[58] Field of Search .................. 437/10, 12, 939, 946, 437/105, 11; 148/DIG. 60

[56] References Cited

U.S. PATENT DOCUMENTS

| | | | |
|---|---|---|---|
| 4,249,962 | 2/1981 | Celler | 357/91 |
| 4,276,114 | 6/1981 | Takano et al. | 437/10 |
| 4,561,171 | 12/1985 | Schlosser | 437/10 |
| 4,645,546 | 2/1987 | Matsushita | 437/939 |
| 4,659,400 | 4/1987 | Garbis et al. | 437/10 |
| 4,751,067 | 6/1988 | Levin | 156/DIG. 64 |

FOREIGN PATENT DOCUMENTS

| | | | |
|---|---|---|---|
| 0289379 | 4/1991 | Germany | 437/10 |
| 169249 | 10/1982 | Japan | 437/10 |
| 61-240638 | 10/1986 | Japan | |
| 240638 | 10/1986 | Japan | 437/12 |
| 15825 | 1/1987 | Japan | 437/10 |
| 76714 | 4/1987 | Japan | 437/10 |
| 63-310123 | 12/1988 | Japan | 437/12 |
| 46937 | 2/1989 | Japan | 437/12 |
| 101636 | 4/1989 | Japan | 437/12 |
| 0235242 | 9/1989 | Japan | 437/11 |
| 201440 | 9/1991 | Japan | 437/10 |
| 238824 | 10/1991 | Japan | 437/12 |

OTHER PUBLICATIONS

IBM Technical Disclosure Bulletin, vol. 20, No. 9, Feb. 1978, New York, US, pp. 3454–3455, M. R. Poponiak, et al., "Impurity Gettering and Removing Gettered Imputities".

IBM Technical Disclosure Bulletin, vol. 22, No. 8B, Jan. 1980, New York, U.S., p. 3856, M. C. Chen, et al., "Pre–Epitaxial Gettering For Defect Reduction in Silicon Films".

Poponiak, M. R., et al. "Gettering Utilizing Implant Damage and Highly Disordered Epitaxial Layer", IBM Technical Disclosure Bulletin, vol. 19, No. 6, pp. 2052–2053 Nov. 1976.

*Primary Examiner*—R. Bruce Breneman
*Assistant Examiner*—Ramamohan Rao Paladugu
*Attorney, Agent, or Firm*—Foley & Lardner

[57] ABSTRACT

A method of manufacturing a semiconductor substrate in which a damage layer is formed on one surface of a wafer. An etching protection film is formed on the damage layer. An epitaxial layer is formed on the other surface of the wafer. Thereafter, the etching protection film is removed to expose the damage layer. The exposed damage layer enhances gettering ability.

14 Claims, 8 Drawing Sheets

1st OX
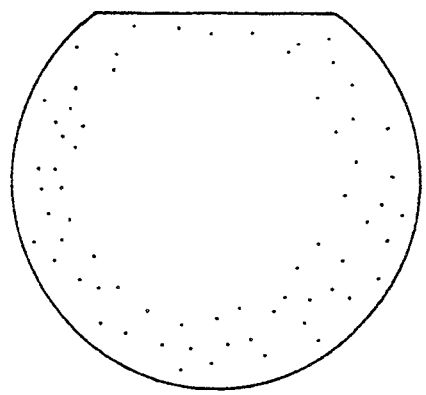
1st OX
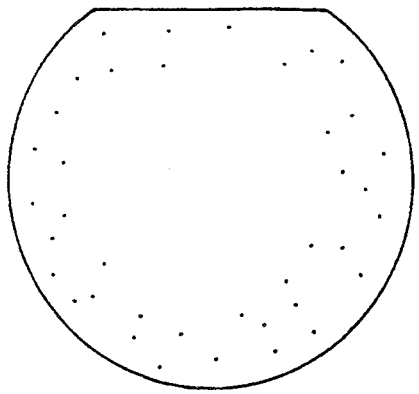
2nd OX
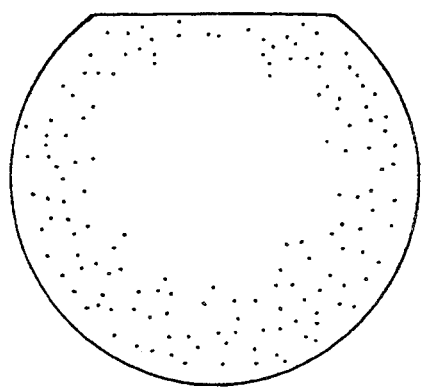
2nd OX
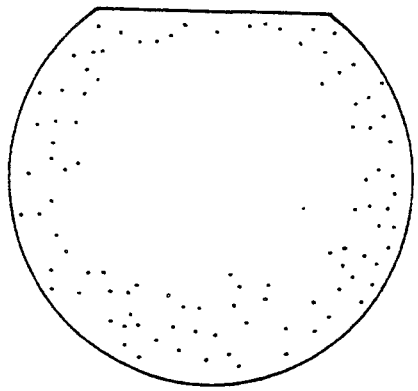
3rd OX
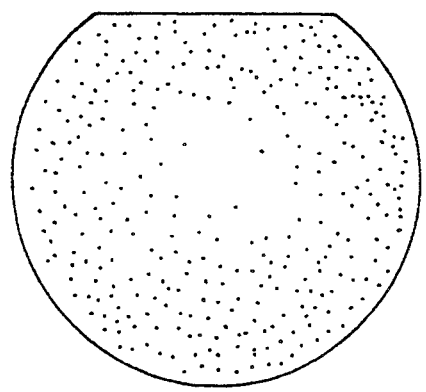
3rd OX
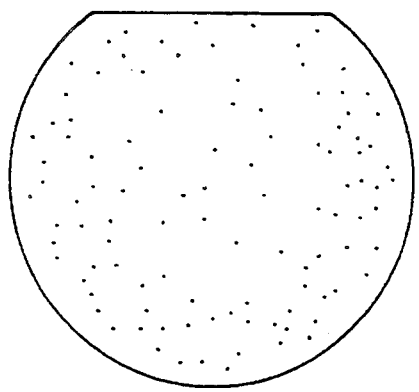
FIG. 3A
PRIOR ART
FIG. 3B
PRIOR ART

METHOD OF MANUFACTURING A SEMICONDUCTOR SUBSTRATE

This application is a divisional of application Ser. No. 07/838,691, filed Feb. 21, 1992, now abandoned.

BACKGROUND OF THE INVENTION

The present invention relates to a method of manufacturing semiconductor substrates, and more particularly to a method of semiconductor substrates suitable for manufacturing memory devices such as a MOS and BiCMOS.

FIELD OF THE INVENTION

FIGS. 1(a) to 1(h) are cross sectional views showing a conventional method of manufacturing semiconductor substrates. FIGS. 1(a) to 1(d) show a general method of manufacturing epitaxial wafers. FIGS. 1(a) and 1(e) to 1(h) show a method of manufacturing epitaxial wafers having BSDs (Back Side Damages) for enhancing gettering ability.

First the general method will be described. FIG. 1(a) shows an ingot 1 before slicing. A wafer 2 is obtained by slicing the ingot 1 and beveling and lapping the sliced portion. The wafer 2 has a damage layer, such as a crushing layer, formed at the time of slicing. This damage layer is removed by chemical etching as shown in FIG. 1(b). Next, as shown in FIG. 1(c) the first principal plane 6 of the wafer 2 is subject to mirror processing by mechanochemical polishing (etching). This mirror processing is repeated twice. Thereafter, the wafer is washed to remove contaminations from the manufacturing steps. Then, as shown in FIG. 1(d), an epitaxial layer 4 is grown on the mirror processed first principal plane 6 to thereby obtain a finished semiconductor substrate.

Next, a method of manufacturing epitaxial wafers having BSDs (Back Side Damages) for improving gettering ability will be described. FIG. 1(a) shows an ingot before slicing. A wafer 2 is obtained by slicing the ingot. The wafer 2 has a damage layer such as a crushing layer formed at the time of slicing. This damage layer is removed by chemical etching as shown in FIG. 1(e). Next, as shown in FIG. 1(f) a damage layer 3 is intentionally formed on the second principal plane 7 of the wafer 2. The wafer 2 is turned upside down and, as shown in FIG. 1(g), the first principal plane 6 is subject to mirror processing by mechanochemical polishing. This mirror processing is repeated twice. Thereafter, the wafer is washed to remove contaminations from the manufacturing steps. Then, as shown in FIG. 1(h), an epitaxial layer 4 is grown on the mirror processed first principal plane 6 to thereby obtain a finished semiconductor substrate.

The latter method is widely used nowadays for manufacturing devices sensitive to contaminations by heavy metal or the like, in order to enhance gettering ability.

In the former method, epitaxial wafers are manufactured using an ingot 1 having a normal oxygen concentration ($1.5 \pm 0.3 \times 10^{18}$ at/cm$^3$: measuring condition; FTIR infrared absorption wavelength 9.8 $\mu$m, 1107 kayser, conversion coefficient $4.81 \times 10^{17}$ astm) as a starting material. This wafer is formed with very minute crystal defects called embryos caused when pulling crystal. However, at the device forming process (e.g., well diffusion) or at a preceding oxidizing process, these embryos have not grown to precipitation by so called BMDs (Bulk Micro Defects) providing gettering ability for impurities such as heavy metal. Therefore, if contaminations occur at a manufacturing process, crystal defects called OSFs (Oxidation induced Stacking Faults) are generated at once, posing a problem of low and unstable manufacturing yield.

In order to solve the above problem, a method is proposed which uses an ingot having a high oxygen concentration as a starting material and a method (called IG (Intrinsic Gettering) which enhances gettering ability by thermal treatments before and after epitaxial growth. These methods are associated, however, with several problems that sufficient gettering ability may not be obtained at earlier device forming processes, and that gettering ability will not retain longer than natural IG (IG by natural crystallization as the processes proceed).

In order to solve these problems, the latter method shown in FIG. 1(a), and 1(e) to 1(f) is used. This method enhances gettering effects at earlier processes including an epitaxial growth process, and is known as EG (Extrinsic Gettering). With this method, the damage layer 3 called BSD (Back Side Damage) is formed on the second principal plane 7 of the wafer 2, the damage layer 3 being used as the gettering side.

However, this method is also associated with a problem of extinction of BSDs during epitaxial growth. FIGS. 2A and 2B are schematic diagrams showing the second principal plane 7 of the epitaxial wafer by a conventional method of manufacturing semiconductor substrates. FIG. 2A is a plan view and FIG. 2B is a schematic cross sectional view taken along line X-X' of FIG. 2A. FIG. 2A shows the shape of the second principal plane 7 observed with or without oblique light beams of a spot light. As shown in FIG. 2A, a white or glittering ring 8 can be observed. This ring 8 can be observed commonly for all epitaxial wafers, although the size, position, and magnitude of the ring change with m/c of epitaxial growth, epitaxial conditions (raw gas, temperature, time and the like), and the mounting condition of a susceptor (supporting member). The ring 8 corresponds to area B shown in FIG. 2B. Area A retains the state of an initial plane, whereas area B is formed with partially swollen deposit. Area C is an etched area, and the etching amount becomes greater at the peripheral area to remove the damage layer of BSDs.

As described above, the damage layer 3 formed on the second principal plane 7 of a semiconductor substrate manufactured by a conventional method is removed at the peripheral area of the wafer 2, in spite of that the damage layer 3 was formed for enhancing gettering ability. Therefore, the gettering ability at the peripheral area is considerably degraded.

Several methods have been tried in order to solve this problem. For example, the damage layer 3 is formed so strong so as not to be removed by an epitaxial growth process. This method is associated, however, with a problem that such a damage layer 3 generates particles, which is a problem rather than an advantage.

FIGS. 3A and 3B illustrate the results of experiments clearly showing the relation between the damage level of the damage layer and gettering ability, and a lowered gettering ability at the peripheral area. A wafer 2 with a weak damage layer 3 is shown in FIG. 3A, and a wafer 2 with a strong damage layer 3 is shown in FIG. 3B. FIGS. 3A and 3B schematically show the distributions of OSFs obtained through crystallinity evaluation of wafers which were forcibly contaminated after epitaxial growth, subjected to repetitive oxidization, and selectively etched. The wafers labeled by 1st OX have been subjected to one oxidizing and etching cycle. The wafers labeled by 2nd OX have been subjected to two oxdizing and etching cycles. The wafers labeled by 3rd OX have been subjected to three oxdizing and etching cycles. As apparent from FIGS. 3A and 3B, the phenomenon of generation of a great number of OSFs at the periphery of a wafer and an increase of OSFs upon repetitive oxidization, was observed although the degree of the phenomenon changes with whether the damage layer is strong or weak. Generation of OSFs means a degraded gettering ability.

From the viewpoint of the above-described problems, it has been long desired to provide a gettering method capable of enhancing gettering ability of an epitaxial wafer.

SUMMARY OF THE INVENTION

The above-described phenomenon will further be discussed with reference to the results of experiments made by the present inventor.

An Si epitaxial growth is a technique for obtaining a monocrystalline growth layer through thermal decomposition or chemical reaction, by setting a temperature to about 1100° C. under a reducing atmosphere and by flowing a raw gas containing Si. In the epitaxial growth, a problem of a low yield caused by generation of a great number of OSFs at the peripheral area of a wafer was found when Si chloride gas (e.g., $SiH_2Cl_2$) was used as raw gas. This problem was not found when raw gas such as $SiH_4$ not containing a chloride was used. From this, the present inventor has noticed that raw gas containing Cl lowers gettering ability at the peripheral area of a wafer.

To further confirm and study the above fact, a wafer formed at one surface with an epitaxial growth layer of about 10 μm was turned upside down, and another epitaxial growth layer was formed at the other surface. $SiCl_4$ gas and temperature 1200° C. were used as the epitaxial growth conditions. After forming the second epitaxial growth layer, the thickness of the first epitaxial growth layer was measured by an infrared interferometry method. It was found that the first epitaxial growth layer became thinner at the area nearer the wafer periphery. This reduction of thickness cannot be neglected even if it is assumed that impurities were distributed again by thermal treatment in the epitaxial growth. From this founding, the present inventor believes that the phenomenon of thickness reduction at the wafer peripheral area results from the presence of etching at that area.

The present invention has been made from the finding of the present inventor obtained from the experiments. It is an object of the present invention to enhance gettering ability by performing epitaxial growth after depositing an etching protection film on a damage layer formed on the bottom surface of a wafer.

According to the present invention, a damage layer is formed on one surface (second principal plane) of a wafer. An etching protection film is deposited on the damage layer, and an epitaxial layer is formed on the other surface (first principal plane) of the wafer. In this manner, gettering ability can be enhanced.

As described above, according to a semiconductor substrate of the present invention, after depositing an etching protection film on a damage layer formed on one surface of a wafer, an epitaxial layer is grown on the other surface. Therefore, it is possible to provide an epitaxial wafer which has a high gettering ability and is suitable for manufacturing highly integrated semiconductor devices.

BRIEF DESCRIPTION OF THE DRAWINGS

FIGS. 3A and 3B schematically illustrate the distributions of OSFs of a wafer subject to forcible contamination and repetitive oxidization.

DESCRIPTION OF THE PREFERRED EMBODIMENTS

An embodiment of the present invention will be described with reference to the accompanying drawings.

Figure 1:
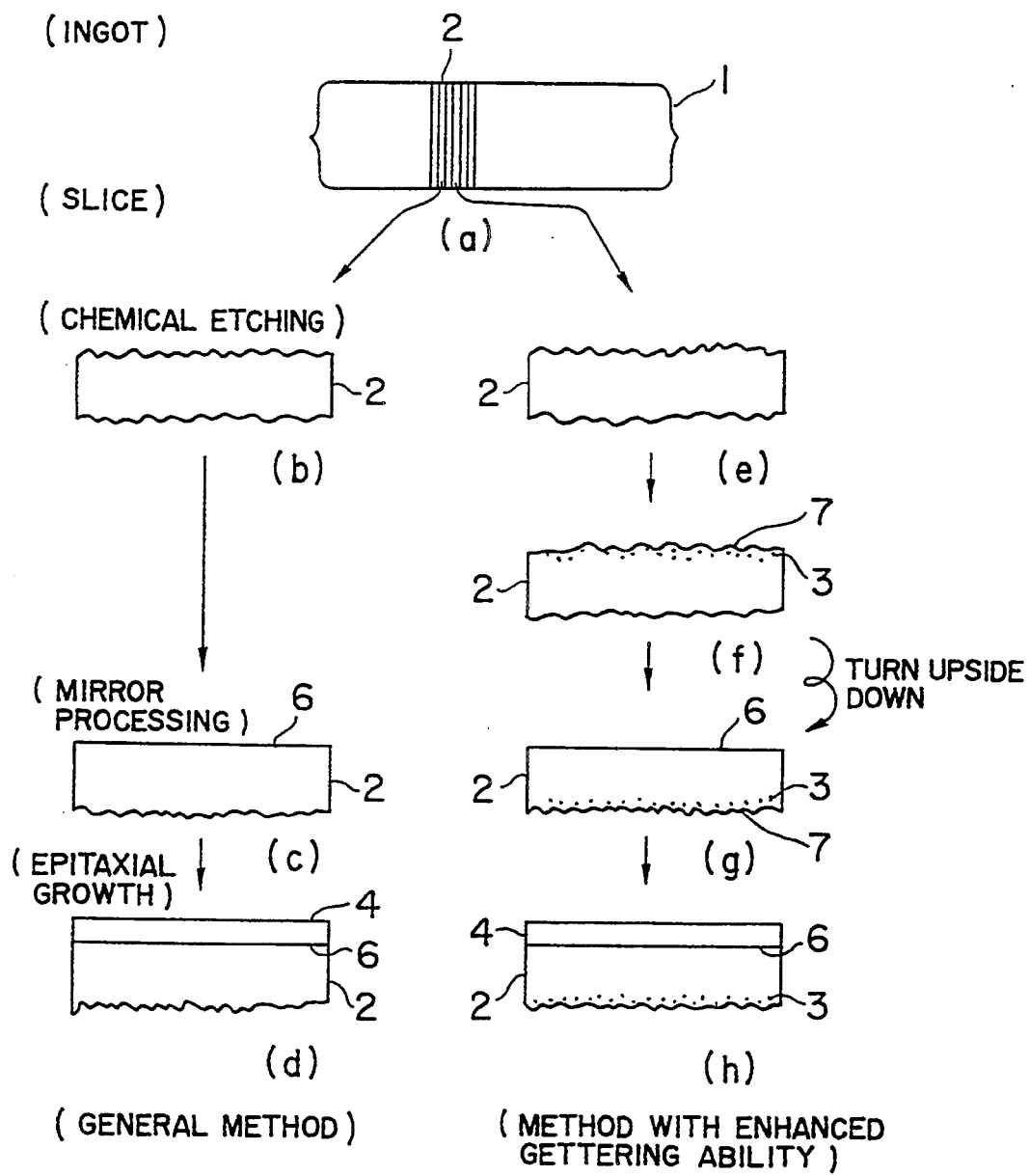
FIG. 1 illustrates a conventional method of manufacturing semiconductor substrates.
Figure 2A:
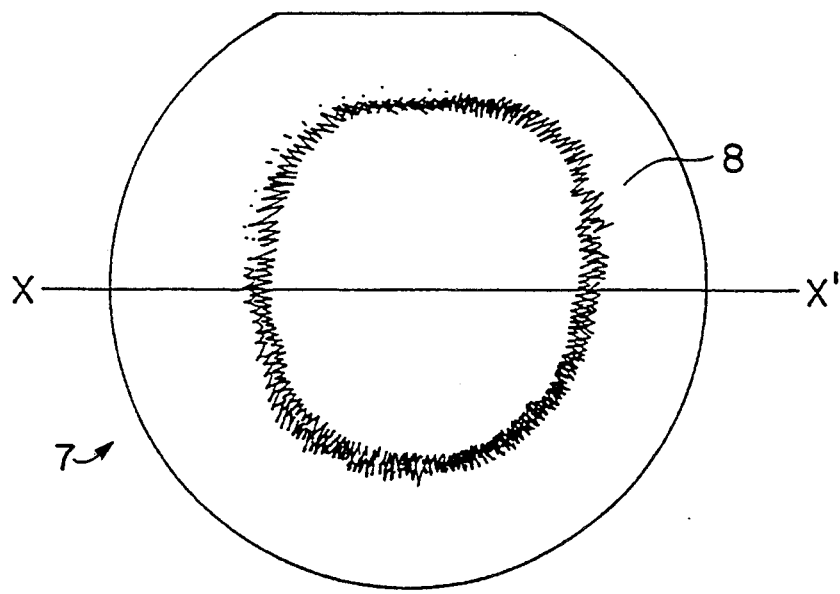
FIG. 2A is a schematic plan view showing an epitaxial wafer manufactured by the conventional method.
Figure 2B:
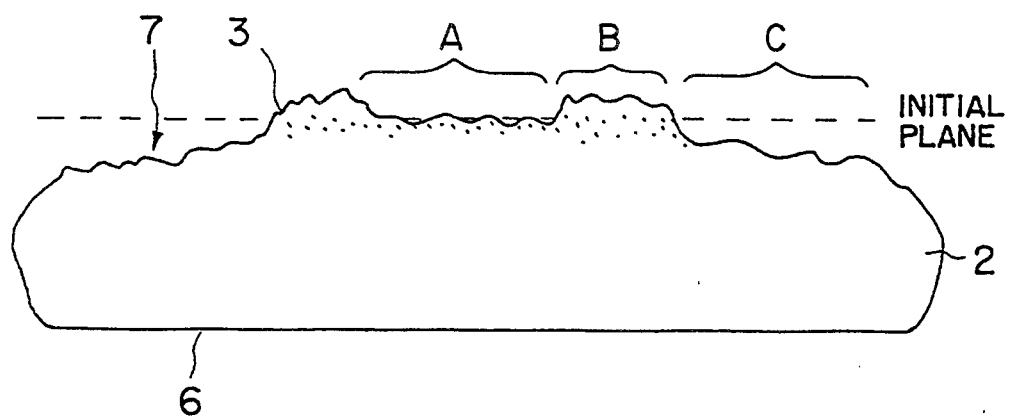
FIG. 2B is a cross sectional view taken along line X-X' of FIG. 2A.
Figure 4:
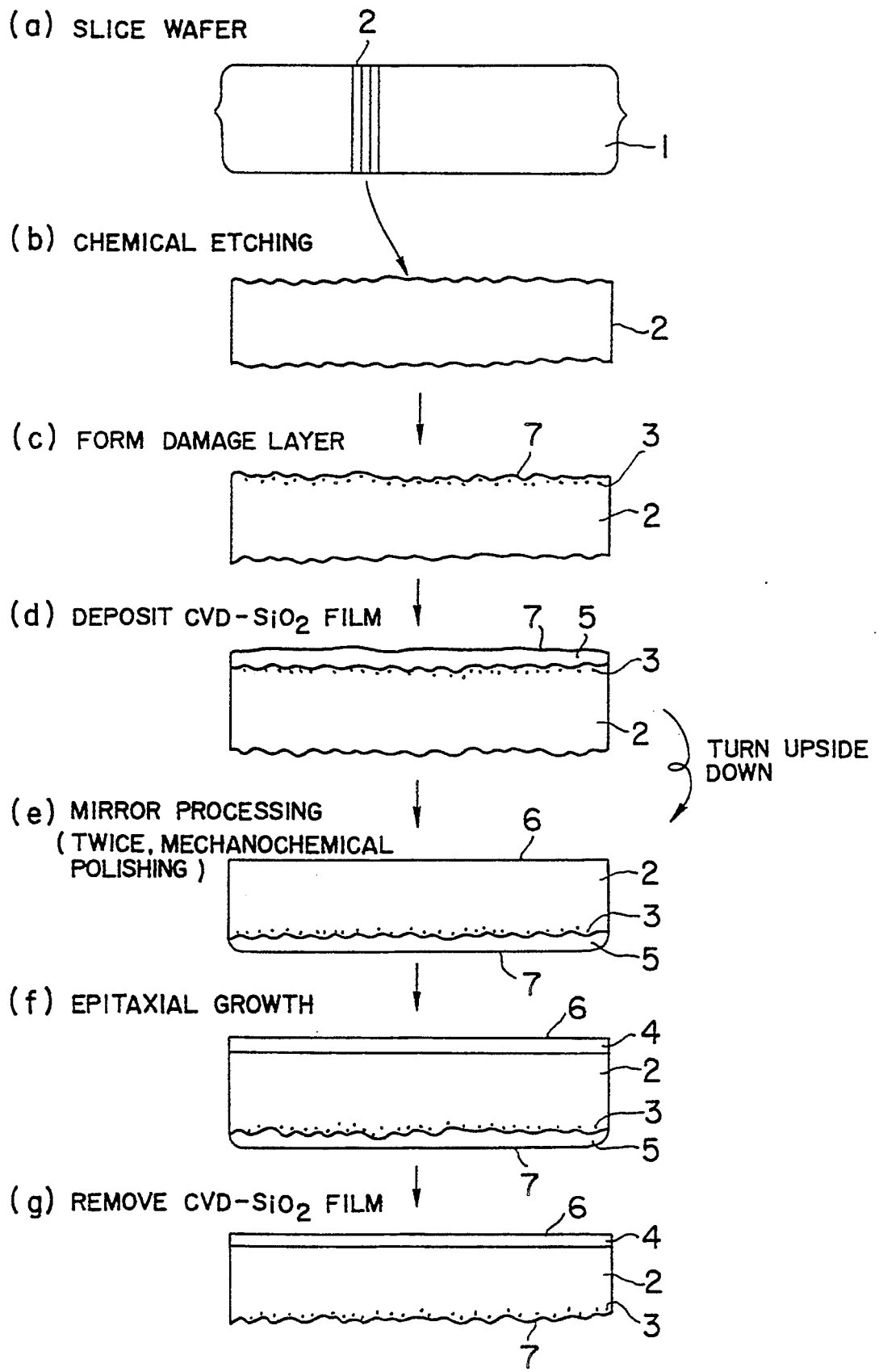
FIG. 4 illustrates a method of manufacturing semiconductor substrates according to an embodiment of the present invention.

FIGS. 4, steps (a) to (g) illustrate a method of manufacturing semiconductor substrates according to the embodiment of the present invention. This method will be described with reference to FIGS. 4(a) to 4(g).

FIG. 4, step (a) shows an ingot 1 before slicing. A wafer 2 is obtained by slicing the ingot 1 and beveling and lapping the slice.

The wafer 2 is formed at its surface with a damage layer such as a crushing layer formed at the time of slicing. This damage layer is removed by chemical etching as shown in FIG. 4, step (b).

Next, as shown in FIG. 4, step (c) a damage layer 3 is intentionally formed on one surface (second principal plane 7) of the wafer 2.

On the damage layer 3, a $CVD-SiO_2$ film 5 of a predetermined thickness is formed by a CVD method as shown in FIG. 4, step (d).

Thereafter, the wafer 2 is turned upside down and, as shown in FIG. 4, step (e), the other surface (first principal plane 6) is subject to mirror processing by performing mechanochemical polishing a plurality of times to obtain a desired flatness. This mirror processing is repeated twice. Thereafter, the wafer 2 is washed to remove contaminations from the manufacturing steps.

Next, as shown in FIG. 4, step (f), an epitaxial layer 4 is grown on the mirror processed first principal plane 6 to thereby obtain a finished semiconductor substrate.

In the epitaxial growth shown in FIG. 4, step (f), the $CVD-SiO_2$ film 5 formed at the step shown in FIG. 4, step (d) serves to prevent etching the damage layer 3. In epitaxial growth, the thickness and specific resistance of an epitaxial layer change with the type of device formed on the wafer 2. The manufacturing conditions are determined depending upon the requirements of each type of device. Therefore, the thickness of the CVD-SiO$_2$ film 5 should be determined depending upon respective manufacturing conditions so as to obtain the effects of the etching protection film. In addition, the thickness of the film 5 should take a minimum value for the purpose of reducing process cost. According to the experiment results of the present inventor, the thickness was generally 500 angstroms or more when an epitaxial layer for a MOS wafer having a thickness of about 10 $\mu$m and specific resistance of several ohms was formed at the temperature of 1140° C. and with raw gas SiHCl$_3$. The damage layer 3 contained about 10$^6$ BSDs/cm$^2$ each having a size (radius) of about 0.5 $\mu$m.

The method of forming BSDs may be any method so long as it provides desired effects. The size and density of BSDs change slightly by the thermal process at the epitaxial growth. The BSD forming conditions are required to be set such that the thermal process at the epitaxial growth will not lower the gettering ability after the epitaxial growth, and will not become the cause of generating particles at the succeeding processes.

In the above embodiment, the damage layer 3 is formed at the process shown in FIG. 4, step (c) before the mirror processing at the process shown in FIG. 4, step (e), and thereafter the CVD-SiO$_2$ film 5 is formed on the process shown in FIG. 4, step (d). Instead, after the mirror processing, the damage layer 3 may be formed and the CVD-SiO$_2$ film 5 may be deposited. In this case, the mirror surface is required to be subject again to the mirror processing. Furthermore, in the above embodiment, as the etching protection film, the CVD-SiO$_2$ film 5 deposited on one surface of the wafer is used. The etching protection film may use other material such as SiN film and polysilicon film so long as it can protect the damage layer 3 during the epitaxial growth. A thermal oxide film may be used for the etching protection film.

A number of characteristic features of semiconductor substrates manufactured by the embodiment method were realized as in the following.

Figures 5A, 5B:
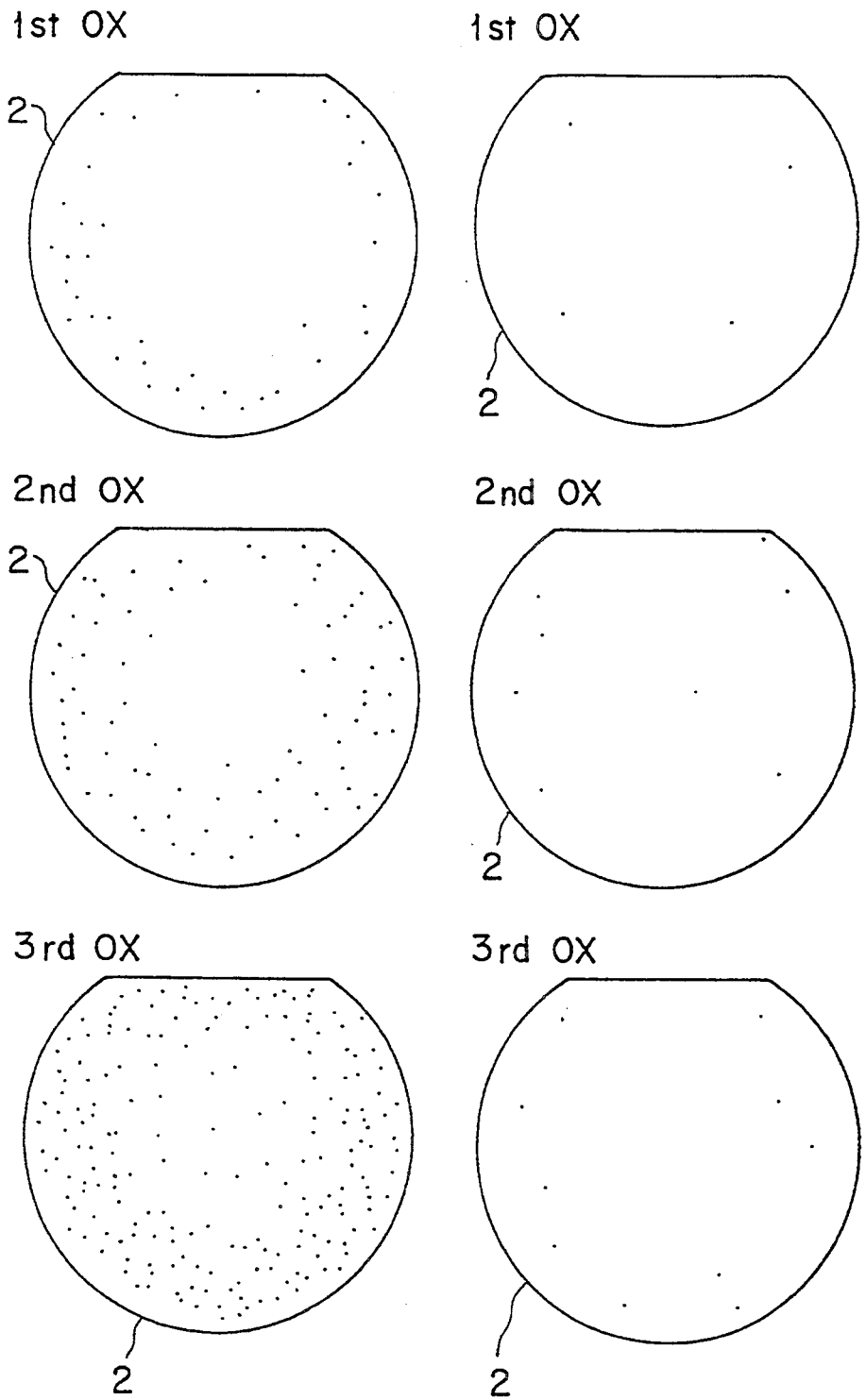
FIGS. 5A and B schematically illustrate the results of experiments for the check of OSFs.

First, evaluation of wafers was performed by checking BSDs using forcible contamination and a multi-oxidization method. The results of experiments for the check of OSFs are schematically shown in FIG. 5. The experiment results for epitaxial wafers manufactured by the conventional method are shown in FIG. 5, step A, and those by the embodiment method are shown in FIG. 5, step B. FIGS. 5, step A and 5, step B show the distributions of OSFs used for the evaluation of crystallinity through selective etching, OSFs being generated by forcibly contaminating epitaxial wafers with Fe or the like of 10$^{12}$ atoms/cm$^2$ and repetitively oxidizing them. As seen from FIG. 5, the conventional method abnormally generated OSFs at the peripheral area of the wafer 2. In contrast, the embodiment method generated almost no OSFs and showed no increase of OSFs. This increase depends on a presence/absence of gettering sites for gettering impurities at the process immediately after the epitaxial growth. Namely, it can be considered that this increase can be avoided by preventing a reduction of gettering sites to be caused by bottom surface etching at the epitaxial growth process.

Figure 6:
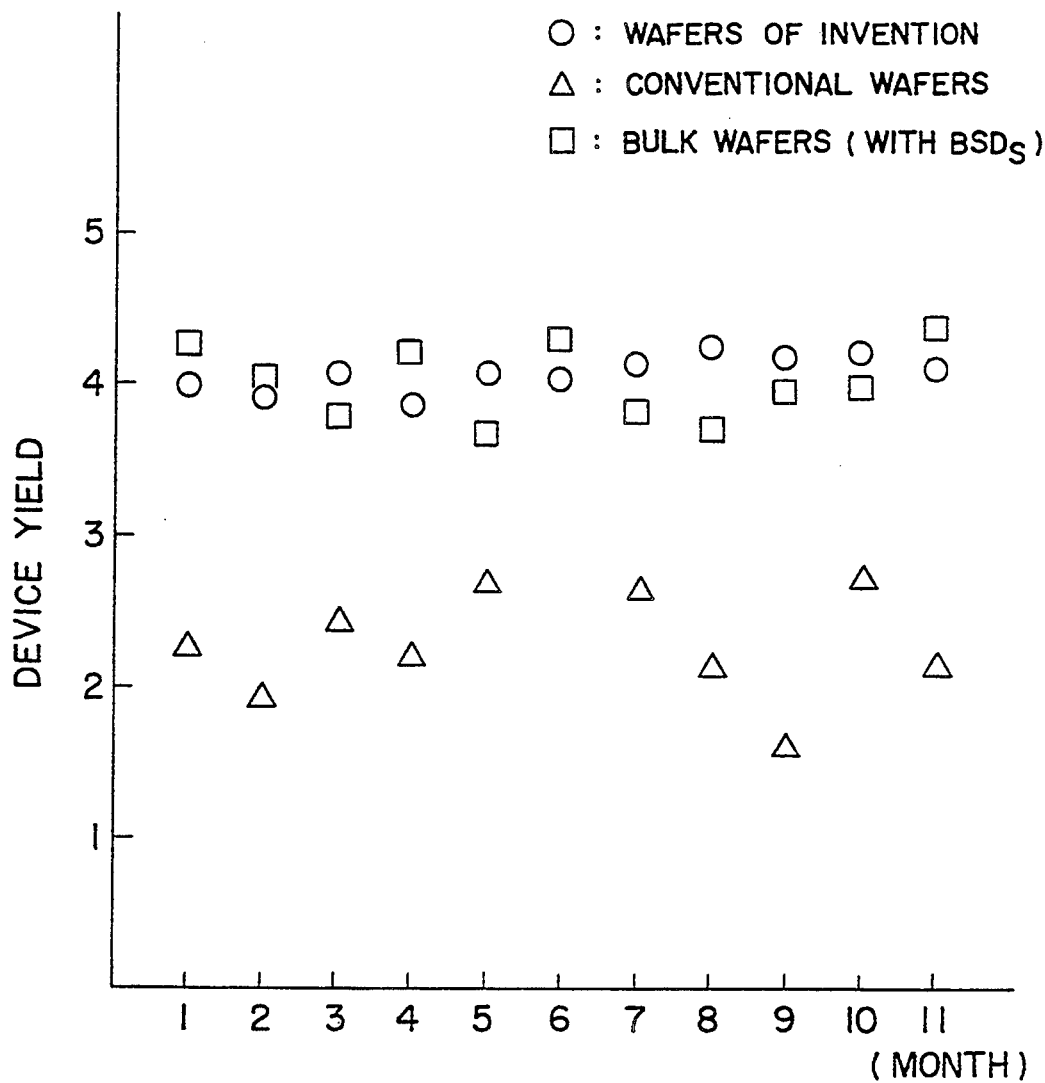
FIG. 6 is a graph showing the monthly yields of semiconductor devices formed on semiconductor substrates manufactured by the embodiment method, relative to the yields by the conventional method.

Next, evaluation of semiconductor devices at manufacturing steps was performed. The evaluation results are shown in FIG. 6. FIG. 6 is a graph showing the evaluation results wherein the monthly yields of semiconductor devices at manufacturing steps are shown relative to the yields by the conventional method. As seen from FIG. 6, the embodiment method provides a stable high yield as compared with that of epitaxial wafers, made by the conventional method. These stable and high yields are the same level as those of bulk wafers with BSDs and without an epitaxial layer.

The causes of such evaluation results can be considered as the following. At the process immediately after the epitaxial growth, the damage layer having a high gettering ability operates as gettering sites for gettering impurities. At the succeeding processes, although the gettering ability of the damage layer lowers due to anneal-out or the like, precipitation generated at thermal treatments operate as new gettering sites for gettering impurities (called natural IG). It can be therefore considered that the gettering ability is maintained during a long time while an epitaxial wafer is subjected to various processes in forming devices. These causes can be attributed to good performance of epitaxial wafers made by the embodiment method, substantially the same as bulk wafers with BSDs, and to advantageous device benchmark results.

Figure 7:
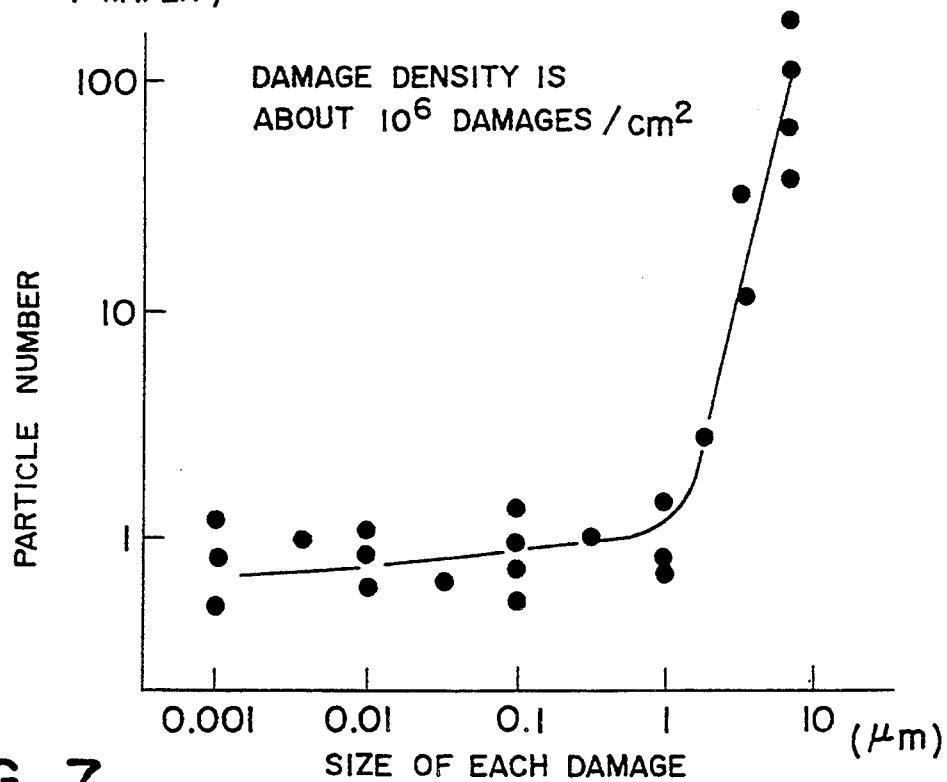
FIG. 7 is a graph showing the size of each damage relative to the number of particles.

The following benchmark results were obtained for a damage layer 3 of a semiconductor substrate made by the embodiment method. FIG. 7 is a graph showing the size of each damage relative to the number of particles. Namely, FIG. 7 shows the relationship between the size of each damage and the number of surface particles generated at the process after the epitaxial growth (N-well process after peeling off the CVD-SiO$_2$ film 5 on the second principal plane 7). As seen from FIG. 7, if the size of damage is 1 $\mu$m or smaller, the number of particles of 3 $\mu$m or larger is one particle per wafer. However, the number of particles increases greatly if the size of damage is 1 $\mu$m or larger. The reason for this can be considered that as the size of each damage becomes large, distortion at the periphery of each damage becomes great, and so each damage generates Si dust or particles after the thermal treatment. From the viewpoint of the number of particles, it is preferable to set an upper limit of the size of each damage to 1 $\mu$m.

Figure 8:
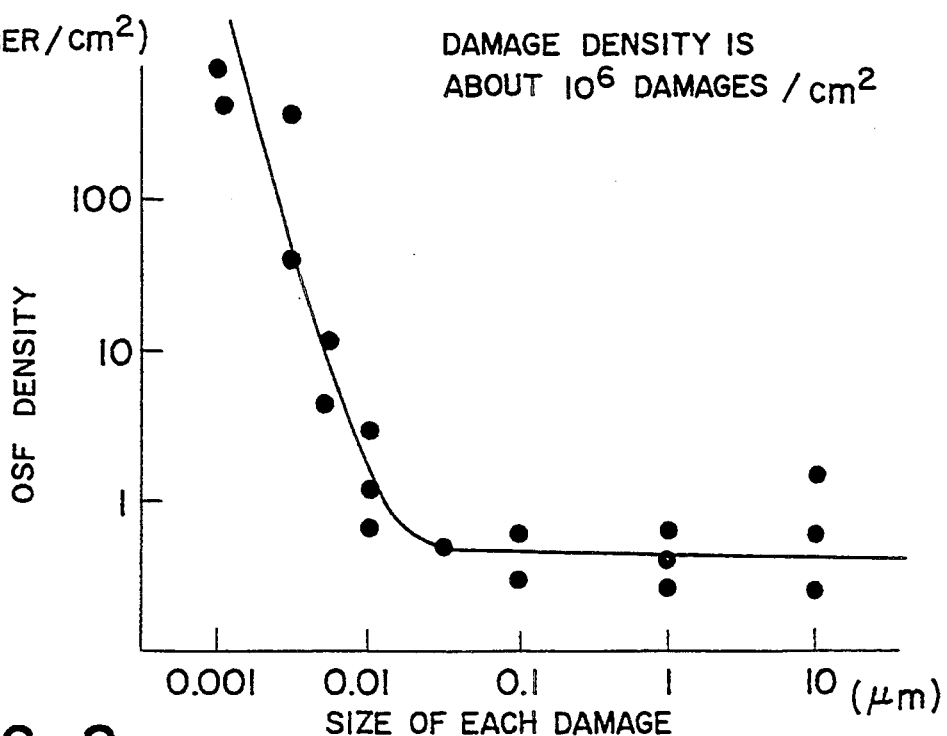
FIG. 8 is a graph showing the size of each damage relative to the density of OSFs.

In order to find a lower limit, the gettering ability was evaluated by forcibly contaminating and repetitively oxidizing a semiconductor substrate. The evaluation results are shown in FIG. 8. The graph of FIG. 8 shows the density of OSFs relative to the size of each damage. As seen from FIG. 8, if the size of a damage is 0.01 $\mu$m or larger, the density of OSFs is one OSFs/cm$^2$ and the gettering ability is sufficient. In contrast, in the range that the size of damage is 0.01 $\mu$m or smaller, as the size of damage becomes smaller, the density of OSFs increases greatly. This can be considered as resulting from anneal-out of the damage layer at the thermal treatment of the epitaxial growth. In the experiments, an epitaxial layer having a thickness of 15 $\mu$m was grown using SiHCl$_3$ gas as source gas, at the temperature of 1140° C. for 15 minutes. If the thermal treatment is performed longer than this time duration, the size of damage will shift slightly larger than 0.01 $\mu$m where the density of OSFs increases greatly.

From the above evaluation results, it can be considered that the size of each damage is preferably within the range of 0.01 to 1 $\mu$m.

Figure 9:
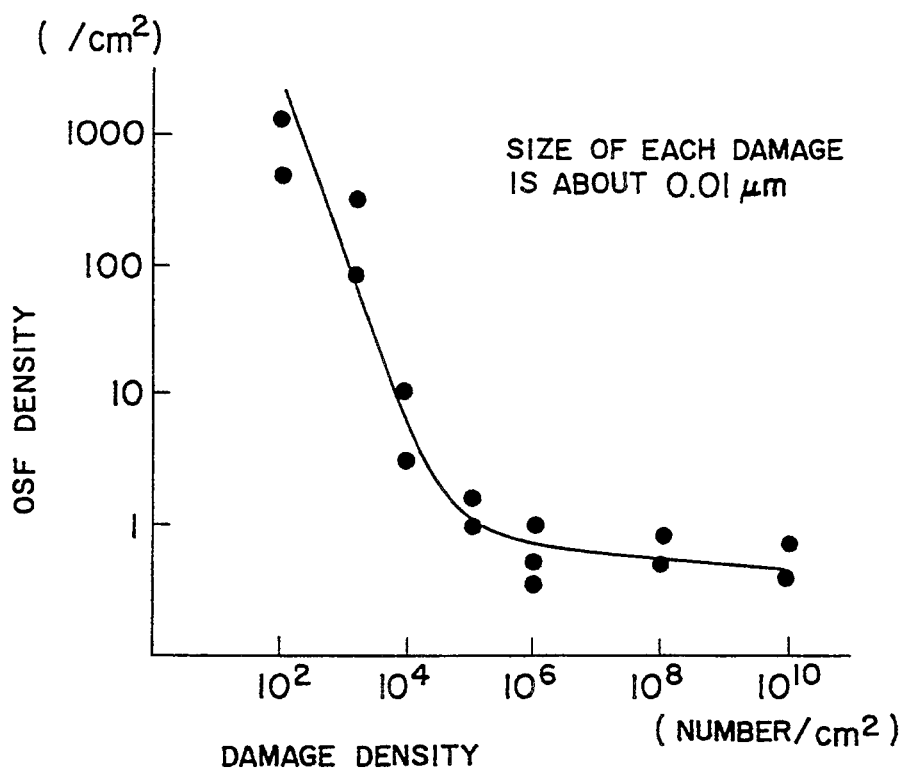
FIG. 9 is a graph showing the damage density relative to the density of OSFs.

Similarly, the density of damages was evaluated. The results are shown in FIG. 9. The graph of FIG. 9 shows the density of OSFs relative to the density of damages. The gettering ability was evaluated for damages of 0.01 μm within the density range from $10^2$ damages/cm² to $10^{10}$ damages/cm², by forcible contamination and repetitive oxidization. As seen from FIG. 9, at the damage density of $10^5$ damages/cm² or more, a sufficient gettering ability was obtained and the generated OSFS was one OSFS/cm². In contrast, at the damage density of $10^5$ damages/cm², it was found that OSFs generate greatly and the gettering ability was insufficient.

Figure 10:
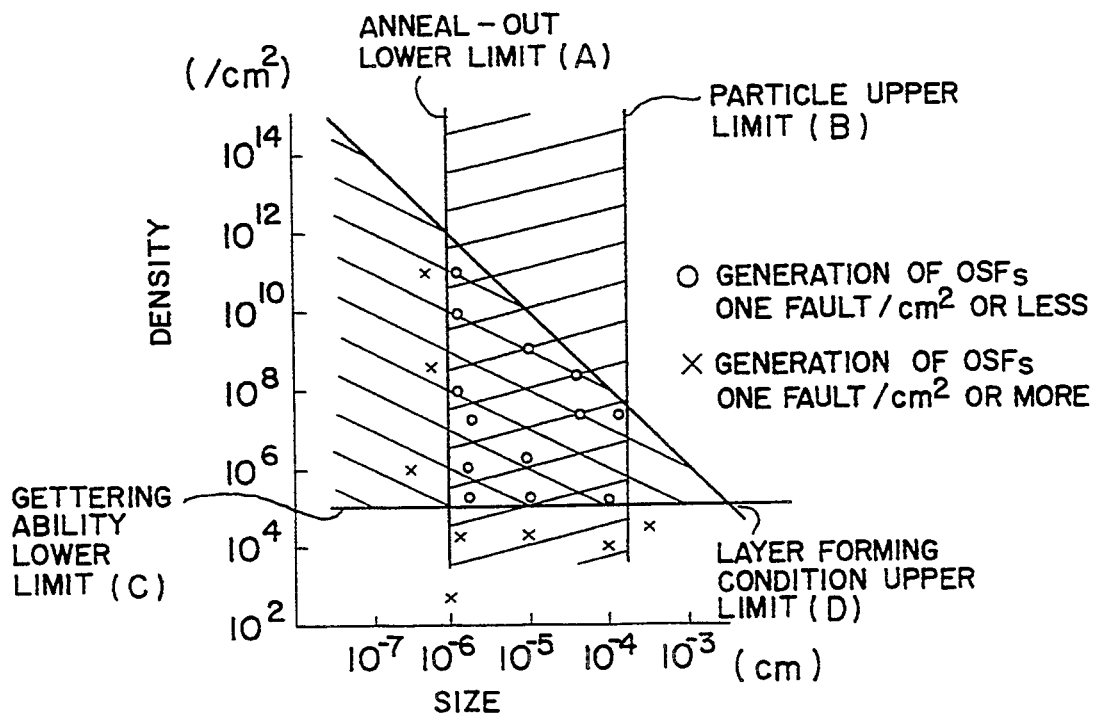
FIG. 10 is a graph showing the relation between the damage layer forming restrictions and the gettering ability.

It was found from the above benchmarks that proper conditions of forming a damage layer exist specific to each size and density. FIG. 10 shows the relation between the damage layer forming conditions relative to the gettering ability. In FIG. 10, (A) represents a lower limit of anneal-out, (B) represents an upper limit of particle ($10^5$/wafer for 0.1 μm or larger), (C) represents a lower limit of gettering ability, and (D) represents an upper limit of damage layer forming conditions. A circle symbol indicates generation of OSFS is one fault/cm² or less, and a cross symbol indicates generation of OSFS is one fault/cm² or more. As seen from FIG. 10, it was found that a sufficient gettering ability was obtained within the damage size range from 0.01 μm to 1 μm and within the damage density of $10^5$ damages/cm².

What is claimed is:

1. A method of manufacturing a semiconductor substrate having first and second principal planes comprising:

a damage layer forming step of forming a damage layer on a second principal plane of a wafer for improving gettering ability;

an etching protection film forming step of forming an etching protection layer on said damage layer for preventing said damage layer from being etched during an epitaxial process; and an epitaxial layer growing step of growing an epitaxial layer on a first principal plane of said wafer after forming said etching protection film.

2. A method according to claim 1, wherein said wafer is Si, and said etching protection film is made of material selected from the group consisting of silicon oxide, silicon nitride, silicon carbide and polysilicon.

3. A method according to claim 1, wherein said damage layer is formed with damages, the radius of each of said damages being 0.01 to 1 μm and the density of said damages being $10^5$ damages/cm² or more.

4. A method according to claim 2, wherein said damage layer is formed with damages, the radius of each of said damages being 0.01 to 1 μm and the density of said damages being $10^5$ damages/cm² or more.

5. A method according to claim 1, wherein said epitaxial layer growing step is performed using $SiHCl_3$ gas as raw gas at a temperature of 1140° C.

6. A method according to claim 3, wherein said epitaxial layer growing step is performed using $SiHCl_3$ gas as raw gas at a temperature of 1140° C.

7. A method according to claim 4, wherein said epitaxial layer growing step is performed using $SiHCl_3$ gas as raw gas at a temperature of 1140° C.

8. A method according to claim 5, wherein said epitaxial layer is grown to a thickness of about 10 μm.

9. A method according to claim 6, wherein said epitaxial layer is grown to a thickness of about 10 μm.

10. A method according to claim 7, wherein said epitaxial layer is grown to a thickness of about 10 μm.

11. A method according to claim 8, wherein said etching protection film is $SiO_2$ having a thickness of at least 500 angstroms.

12. A method according to claim 9, wherein said etching protection film is $SiO_2$ having a thickness of at least 500 angstroms.

13. A method according to claim 10, wherein said etching protection film is $SiO_2$ having a thickness of at least 500 angstroms.

14. A method according to claim 1, wherein said epitaxial growing step is followed by the step of removing said etching protection film from said damage layer.

* * * * *